(12) United States Patent
Chang

(10) Patent No.: US 9,380,734 B2
(45) Date of Patent: Jun. 28, 2016

(54) CONTAINER WITH COOLING SYSTEM

(75) Inventor: Yao-Ting Chang, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 956 days.

(21) Appl. No.: 13/526,123

(22) Filed: Jun. 18, 2012

(65) Prior Publication Data
US 2013/0252536 A1    Sep. 26, 2013

(30) Foreign Application Priority Data

Mar. 21, 2012 (TW) .............................. 101109599 A

(51) Int. Cl.
F24F 13/14 (2006.01)
H05K 7/20 (2006.01)
H05K 7/14 (2006.01)

(52) U.S. Cl.
CPC .......... H05K 7/20745 (2013.01); H05K 7/1497 (2013.01)

(58) Field of Classification Search
CPC ................. H05K 7/20745; H05K 7/1497
USPC .................................. 454/155, 184, 256, 313
See application file for complete search history.

(56) References Cited

U.S. PATENT DOCUMENTS

| 4,007,673 | A | * | 2/1977 | Zaloga | F24F 13/15 |
| | | | | | 415/125 |
| 6,747,872 | B1 | * | 6/2004 | Patel | G06F 1/20 |
| | | | | | 165/104.33 |
| 7,031,870 | B2 | * | 4/2006 | Sharma et al. | 702/130 |
| 7,238,103 | B2 | * | 7/2007 | Terai et al. | 454/155 |
| 7,738,251 | B2 | * | 6/2010 | Clidaras | G06F 1/20 |
| | | | | | 165/80.4 |
| 7,961,463 | B2 | * | 6/2011 | Belady et al. | 361/695 |
| 2009/0129016 | A1 | * | 5/2009 | Hoeft et al. | 361/694 |
| 2009/0293518 | A1 | * | 12/2009 | Bettella | F04D 25/12 |
| | | | | | 62/186 |
| 2011/0128699 | A1 | * | 6/2011 | Heydari | H05K 7/20745 |
| | | | | | 361/679.48 |
| 2011/0198404 | A1 | * | 8/2011 | Dropmann | 236/49.3 |

FOREIGN PATENT DOCUMENTS

TW    200739237 A    10/2007

* cited by examiner

Primary Examiner — Gregory Huson
Assistant Examiner — Dana Tighe
(74) Attorney, Agent, or Firm — ScienBiziP, P.C.

(57) ABSTRACT

A container includes an air conditioner, a double group of air conductor sheets and a number of racks. The air conditioner includes at least one air outlet. The double group of air conductor sheets is positioned in the at least one air outlet. The double group of air conductor sheet includes a first group of air conductor sheets and a second group of air conductor sheets oriented in different directions. The double group of air conductor sheets is positioned between the racks. The first group of air conductor sheets rotates toward the racks positioned at two sides, and the second group of air conductor sheets rotates toward the racks positioned at two ends.

1 Claim, 5 Drawing Sheets

CONTAINER WITH COOLING SYSTEM

BACKGROUND

1. Technical Field

The disclosure generally relates to a container including a cooling system.

2. Description of Related Art

To quickly establish a cloud operating system, a container may be used as a room for the cloud operating system. When designing a container for containing multiple computer servers, an air conditioner is installed in the container for controlling the temperature to maintain a desired level to cool the computer servers.

However, the air conditioner is configured to force air to flow passed all the computer servers which are cooled accordingly. However, each computer server or each row of the computer servers might produce different levels of heat. The air conditioner cannot direct the air flow to the computer servers producing a high level of heat according to need.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary container with cooling system. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
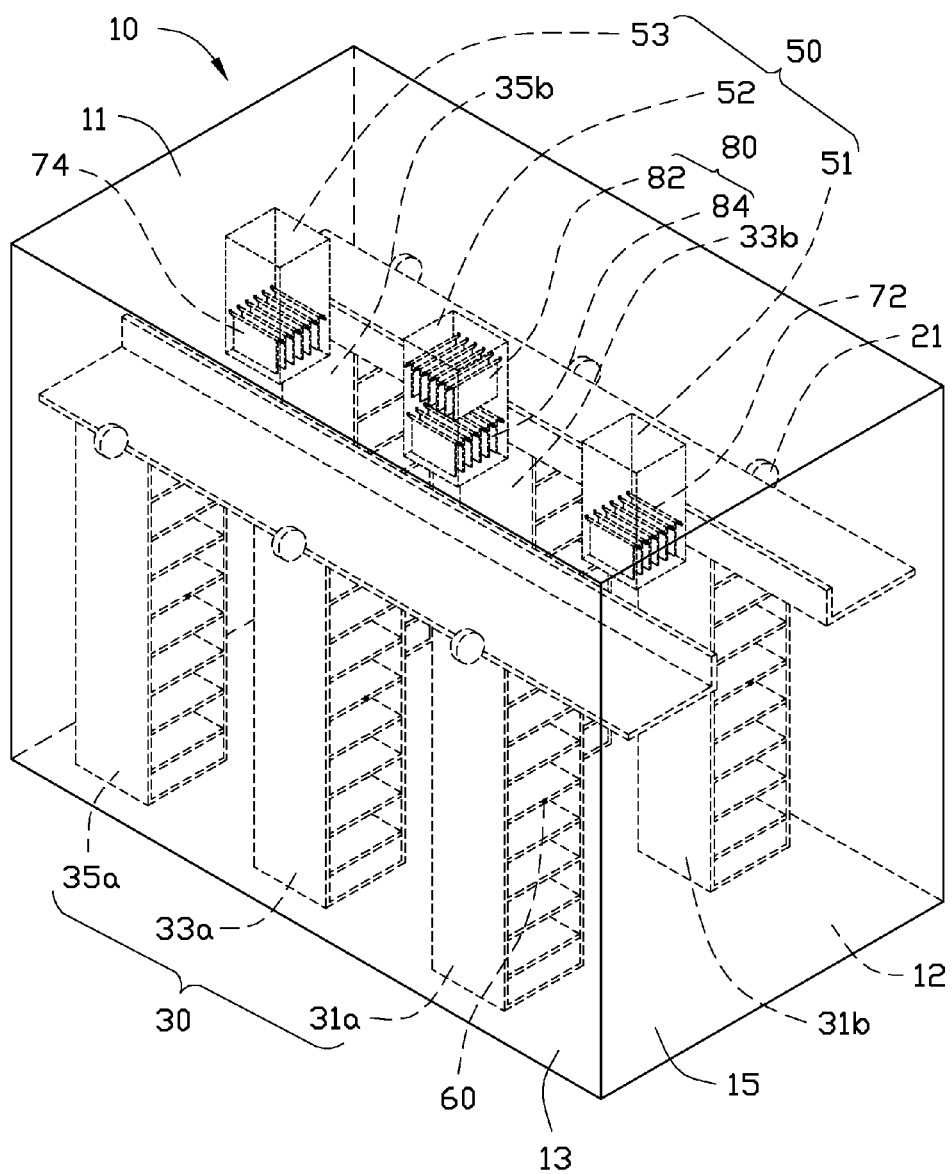
FIG. 1 is a schematic view of an exemplary embodiment of a container including a cooling system.
Figure 2:
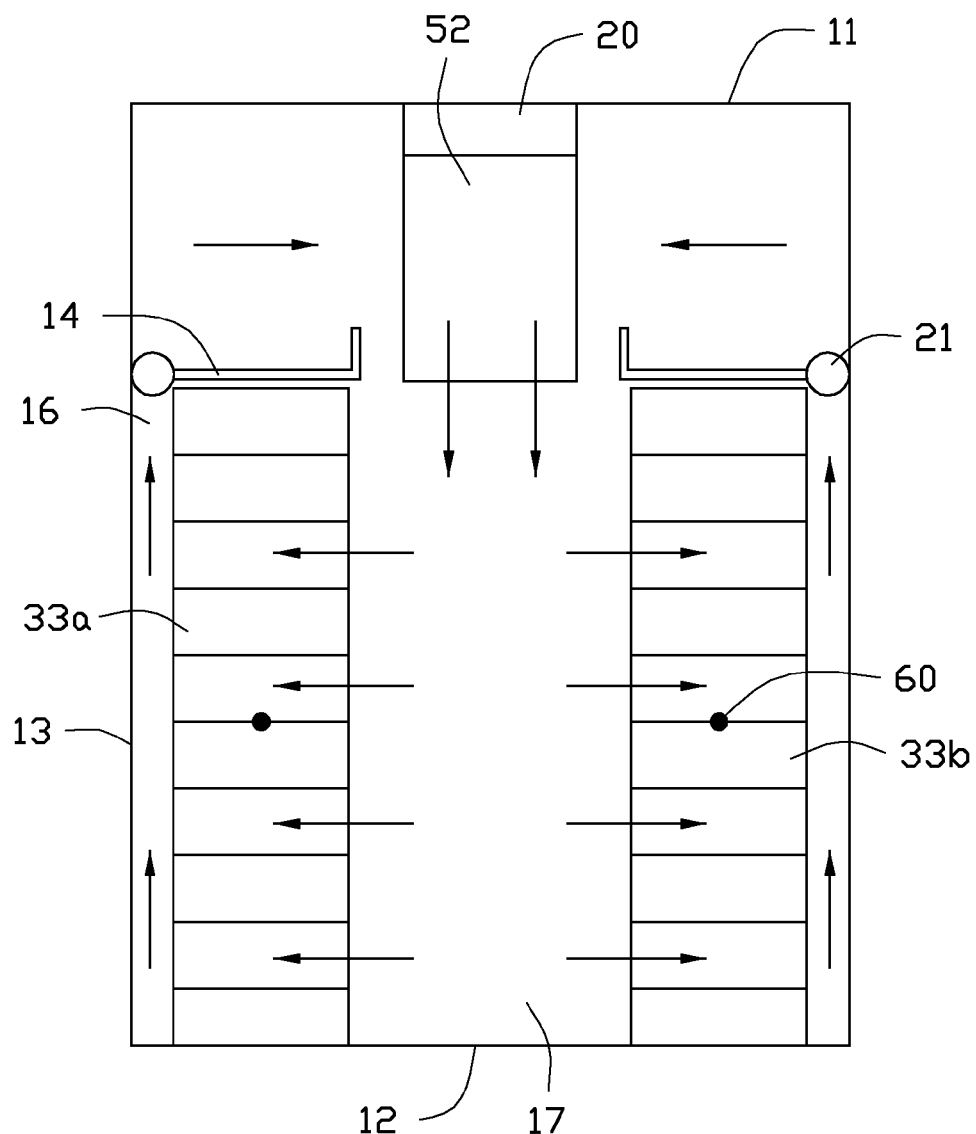
FIG. 2 is a schematic view in the container in FIG. 1 showing a flow path of hot and cold airflows.

FIGS. 1-2 show a container 10 used for housing electronic components, such as computer servers. In this exemplary embodiment, the container 10 includes a central air conditioner 20, a number of racks 30, and a number of fans 50.

The container 10 includes a top wall 11, a bottom wall 12, two side walls 13, and two end walls 15 cooperatively defining a hollow space. The air conditioner 20 is positioned on the top wall 11 inside the hollow space. The air conditioner 20 includes a number of air outlets 51. In this exemplary embodiment, the air conditioner 20 includes a first air outlet 51, a second air outlet 52, and a third air outlet 53. The second air outlet 52 is positioned between the first air outlet 51 and the third air outlet 53.

The racks 30 are divided into two rows, and are symmetrically mounted in the container 10. In this exemplary embodiment, a first row of the racks 30 has a first rack 31a, a second rack 33a, and a third rack 35a, and a second row of the racks 30 has a first rack 31b, a second rack 33b, and a third rack 35b. The first rack 31a, the second rack 33a, and the third rack 35a are positioned at a first side, the first rack 31b, the second rack 33b, and the third rack 35b are positioned at a second side. Computer servers (not shown) are arranged in the racks 30.

Two frames 14 are symmetrically mounted in the container 10. The frames 14 divide the container 10 to create a middle airflow channel 17 and two side airflow channels 16. Each computer server has conventional air vents (not shown) that allow air to be drawn into and out of the computer server. The first air outlet 51, the second air outlet 52, and the third air outlet 53 are positioned in the middle airflow channel 17. The fans 50 are positioned in the side airflow channels 16. A cold airflow from the air outlets 51 flows into the middle airflow channel 17. Inside fans in the computer servers further force the cold airflow to pass through the computer server. The cold airflow passes through the computer servers on the rack 30 to become warm air. The fans 50 draws the warm air exit through side airflow channels 16 to allow warm airflow to pass through. A temperature sensor 60 is positioned on each of the racks 30 for detecting a temperature of each rack 30. In this exemplary embodiment, each temperature sensor 60 is positioned near or at a vertical middle of each rack 30.

The first air outlet 51 and the third air outlet 53 respectively include air conductor sheets 72, 74. The second air outlet 52 includes a double group of air conductor sheets 80. The air conductor sheets 72 are made of a number of swingable plates parallel to each other when at rest. Also, when at rest, the air conductor sheets 72 are parallel to the side walls 13 of the container 10, but can swing from zero degrees to a desired degree (e.g. 45 degrees) toward the first rack 31a or 31b. The air conductor sheets 74 are similar to the air conductor sheets 72. The air conductor sheets 74 in the third air outlet 53 can swing toward the third rack 35a or 35b. The air conductor sheets 72 and the air conductor sheets 74 are driven by conventional motors 72a, 74a, respectively, the motors 72a, 74a, controlled by the control device 40.

The double group of air conductor sheets 80 includes a first group of air conductor sheets 82 and a second group of air conductor sheets 84. The first group of air conductor sheets 82 and the second group of air conductor sheets 84 are made of a number of plates parallel to each other when at rest. The first group of air conductor sheets 82 is parallel to the ends walls 15, and the second group of air conductor sheets 84 is parallel to the side walls 13 when at rest. The first group of air conductor sheets 82 can swing from zero degrees to a desired degree (e.g. 45 degrees) toward the first racks 31a, 31b or the third racks 35a, 35b. The second group of air conductor sheets 84 can swing from zero degrees to a desired degree (e.g. 45 degrees) toward the second rack 33a or 33b. The first group of air conductor sheets 82 and the second group of air conductor sheets 84 are also driven by conventional motors 82a, 84a, respectively, the motors 82a, 84a, controlled by the control device 40.

Figure 3:
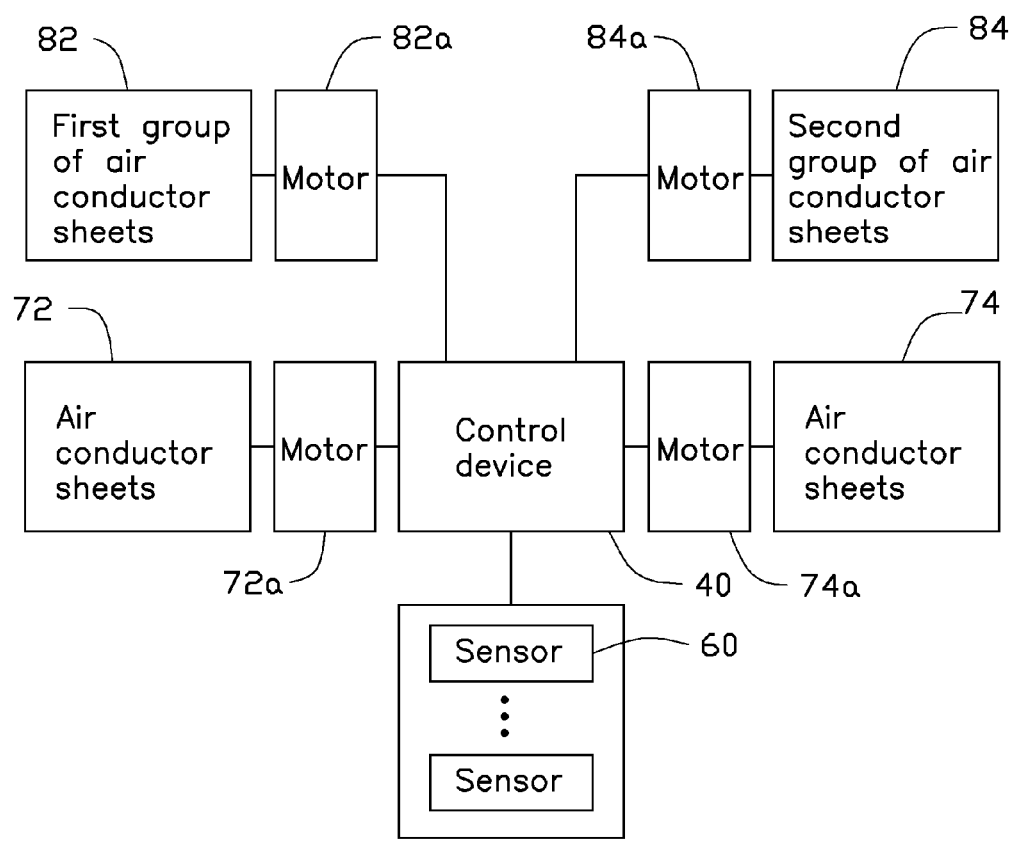
FIG. 3 is a block diagram depicting the control system for controlling the container with cooling system.

FIG. 3 is a block diagram depicting the control system for controlling the container. A control device 40 is electrically connected to the temperature sensors 60. The air conductor sheets 72, 74 are each electrically connected to the control device 40. Conventional motors (72a, 74a, 82a, 84a) for swinging the first group of air conductor sheets 82 and the second group of air conductor sheets 84 are electrically connected to the control device 40. The control device 40 can receive data as to a temperature of each rack 30 detected by the temperature sensors 60. The controller device 40 compares the detected temperature with a predetermined temperature, for example, 25° C. If the temperatures of the second rack 33a, 33b are determined to be less than the predetermined temperature and the temperatures of the first rack 31a, 31b or the third rack 35a, 35b are determined to exceed than the predetermined temperature, the control device 40 transmits a signal to the motor 82a, on the first group of air conductor sheets 82 for swinging the first group of air conductor sheets 82 toward the first rack 31a, 31b or the third rack 35a, 35b. If the temperature of the second racks 33a is determined to be less than the predetermined temperature and the temperature of the second rack 33b is determined to exceed than the predetermined temperature, the control device 40 transmits a signal to the motor 84a on the second group of air conductor sheets 84 for swinging the second group of air conductor sheets 84 toward the second rack 33b. Similarly, if the temperature of the first racks 31a at the first side is determined to be less than the predetermined temperature and the temperature of the first rack 31b at the right side is determined to exceed the predetermined temperature, the control device 40 transmits a signal to the motor 72a on the air conductor sheets 72 for swinging the air conductor sheets 72 toward the first rack 31b. If the temperature of the third racks 35a at the first side is determined to be less than the predetermined temperature and the temperature of the third rack 35b at the second side is determined to exceed the predetermined temperature, the control device 40 transmits a signal to the motor 74a on the air conductor sheets 74 for swinging the air conductor sheets 74 toward the third rack 35b at the second side.

Figure 4A:
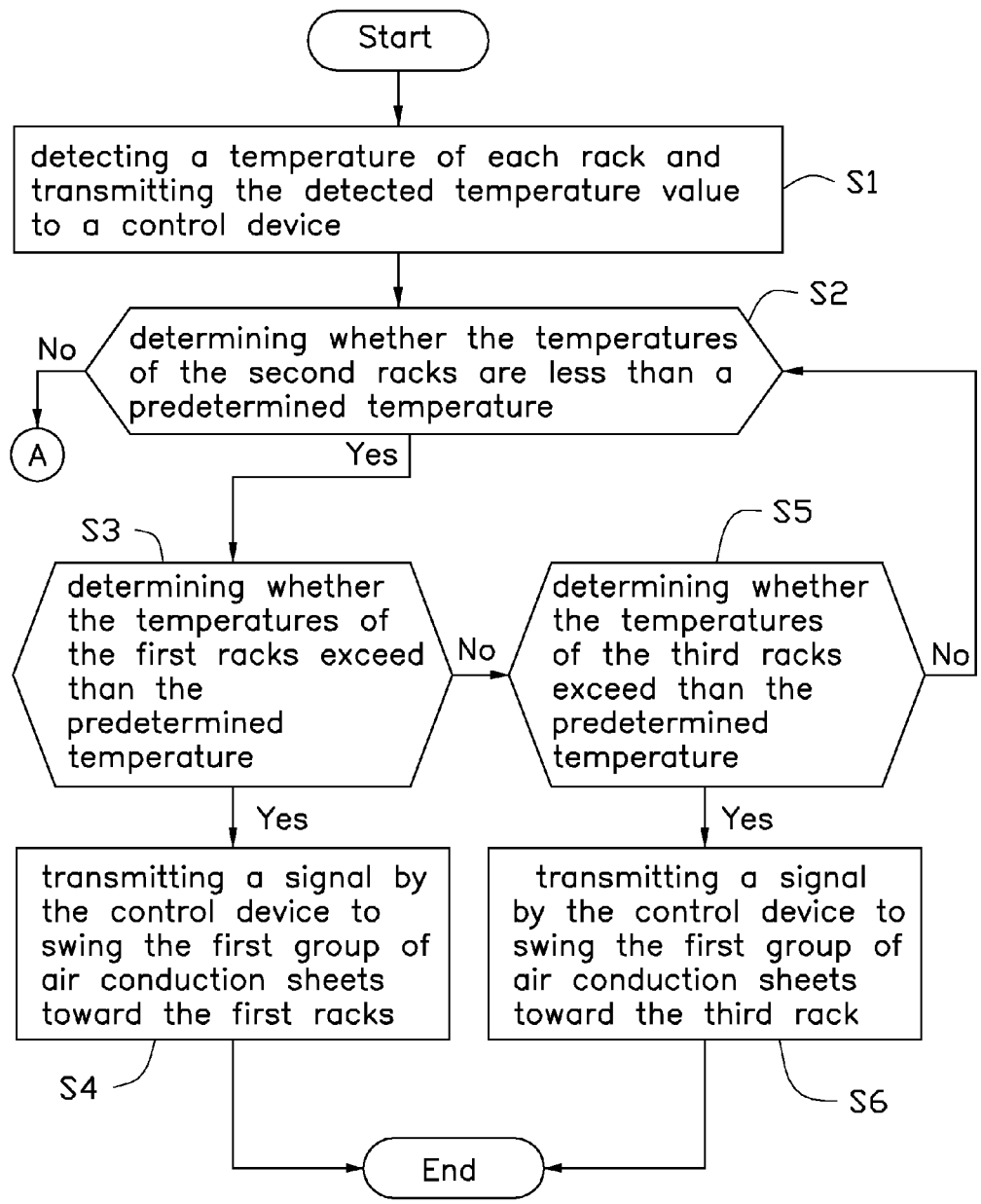
FIGS. 4A and 4B are flowcharts illustrating a cooling method of the cooling system in FIG. 1, describing the process of the air conditioner cooling the container.
Figure 4B:
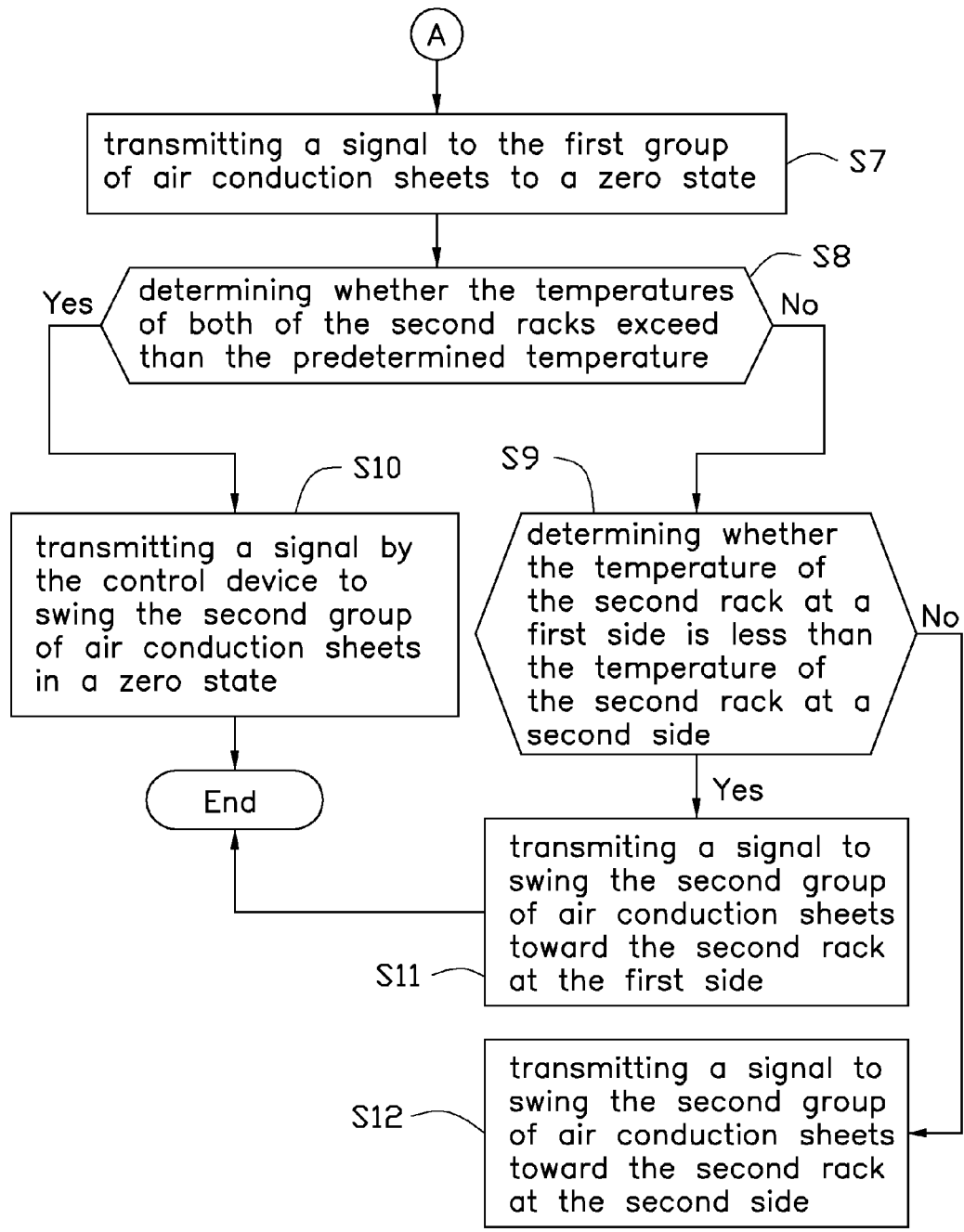

FIGS. 4A and 4B, show a cooling method in which the air conditioner cools the container 10. The cooling method uses the double air conductor sheets 80 as an example to illustrate the cooling method. The cooling method includes at least the following steps:

In step S1, the temperature sensors 60 detect a temperatures of each of the racks 30, and transmit the detected temperature values to the control device 40.

In step S2, the control device 40 determines whether the temperatures of the second rack 33a, 33b are less than a predetermined temperature, for example, 25° C. If the temperature of one of the second rack 33a, 33b exceeds the predetermined temperature, step S7 is implemented. If the temperatures of the second rack 33a, 33b are both less than the predetermined temperature, the control device 40 transmits a signal to the second group of air conduction sheets 84 to assume a zero degrees state, and step S3 is implemented.

In step S3, the control device 40 determines whether the temperatures of the first rack 31a, 31b exceed the predetermined temperature. If the temperatures of the first rack 31a, 31b exceed the predetermined temperature, step S4 implemented. If the temperatures of the first rack 31a, 31b are less than the predetermined temperature, step S5 implemented.

In step S4, the control device 40 transmits a signal to the motor 82a that swings the first group of air conduction sheets 82 toward the first rack 31a, 31b.

In step S5, the control device 40 determines whether the temperatures of the third rack 35a, 35b exceed the predetermined temperature. If the temperatures of the third rack 31a, 31b exceed the predetermined temperature, step S6 implemented. If the temperatures of the third rack 31a, 31b are less than the predetermined temperature, step S2 is implemented.

In step S6, the control device 40 transmits a signal to the motor 82a that swings the first group of air conduction sheets 82 toward the third rack 35a, 35b.

In step S7, the control device 40 transmits a signal to the first group of air conduction sheets 82 to assume a zero state. In the zero degrees state, the first group of air conduction sheets 82 are parallel to the end walls 15.

In step S8, the control device 40 determines whether the temperatures of both of the second rack 33a, 33b exceed the predetermined temperature. If the temperatures of both of the second rack 33a, 33b exceed the predetermined temperature, step S10 is implemented. If the temperature of the second racks 33a or 33b is less than the predetermined temperature, step S9 is implemented.

In step S9, the control device 40 determines whether the temperature of the second rack 33a at the first side is less than the temperature of the second rack 33b at the second side. If the temperature of the second rack 33a at the first side is less than the temperature of the second rack 33b at the second side, step 11 is implemented. If the temperature of the second rack 33a exceeds the temperature of the second rack 33b, step 12 is implemented.

In step S10, the control device 40 transmits a signal to swing the second group of air conduction sheets 82 into a zero degrees state.

In step S11, the control device 40 transmits a signal to the motor 84a that swings the second group of air conduction sheets 84 toward the second rack 33b at the second side.

In step S12, the control device 40 transmits a signal to the motor 84a that swings the second group of air conduction sheets 84 toward the second rack 33a at the first side.

The principle of the air conductor sheets 72 is similar to the second group of air conductor sheets 84. The control device 40 determines whether the temperature of the first rack 31a at the first side is less than the temperature of the third rack 31b at the second side. If the temperature of the first rack 31a at the first side is less than the temperature of the first rack 31b at the second side, the control device 40 transmits a signal to the motor 72a that swings the air conduction sheets 72 toward the first rack 31b at the second side. If the temperature of the first rack 31a exceeds the temperature of the first rack 31b, the control device 40 transmits a signal to the motor 72a that swings the air conduction sheets 72 toward the first rack 31a at the first side. The air conductor sheets 74 function in a manner similar to that of the air conductor sheets 72, and herein is not detailed.

The container of the present disclosure may use an air conditioner to cool the container, preventing a waste of power.

It is to be understood, however, that even through numerous characteristics and advantages of the disclosure have been set forth in the foregoing description, together with details of the system and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A container comprising:
   an end wall;
   a side wall substantially perpendicular to the end wall;
   an air conditioner including at least one air outlet;
   a double group of air conductor sheets positioned in the at least one air outlet; the double group of air conductor sheets including a first group of air conductor sheets and a second group of air conductor sheets; each of the first group of air conductor sheets being parallel to the end wall and arranged in a first direction, and each of the second group of air conductor sheets being parallel to the side wall and arranged in a second direction that is substantially perpendicular to the first direction;
   a plurality of racks, the double group of air conductor sheets positioned between the racks,
   the first group of air conductor sheets rotating toward the racks positioned at two sides, the second group of air conductor sheets rotating toward the racks positioned at two ends;

wherein the first group of air conductor sheets and the second group of air conductor sheets are made of a number of swingable plates parallel to each other; and
the first group of air conductor sheets and the second group of air conductor sheets can be swung by motors from zero to 45 degrees.

* * * * *